(12) United States Patent
Park et al.

(10) Patent No.: US 9,006,625 B2
(45) Date of Patent: Apr. 14, 2015

(54) METHOD FOR FORMING CONDUCTIVE PATTERNS USING MICROWAVE

(75) Inventors: Jung-Ho Park, Daejeon (KR); Joon-Hyung Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 657 days.

(21) Appl. No.: 13/016,559

(22) Filed: Jan. 28, 2011

(65) Prior Publication Data
US 2011/0185934 A1    Aug. 4, 2011

(30) Foreign Application Priority Data
Jan. 29, 2010   (KR) .................. 10-2010-0008660

(51) Int. Cl.
| | | |
|---|---|---|
| *H05B 6/64* | (2006.01) | |
| *B23B 9/00* | (2006.01) | |
| *B41F 33/00* | (2006.01) | |
| *B41J 2/01* | (2006.01) | |
| *H05K 1/11* | (2006.01) | |

(52) U.S. Cl.
CPC . *B41F 33/00* (2013.01); *B41J 2/01* (2013.01); *H05K 1/11* (2013.01)

(58) Field of Classification Search
CPC ............... B41F 33/00; B41J 2/01; H05K 1/11
USPC .......... 219/679, 730, 759; 426/107, 234, 243; 99/DIG. 14; 428/137, 209, 210, 428; 118/723 MW, 723 E, 718, 723 MP
See application file for complete search history.

(56) References Cited

U.S. PATENT DOCUMENTS

| | | | | |
|---|---|---|---|---|
| 5,038,009 A | * | 8/1991 | Babbitt | 219/730 |
| 5,202,692 A | * | 4/1993 | Huguenin et al. | 342/179 |
| 6,045,893 A | * | 4/2000 | Fukushima et al. | 428/209 |
| 7,386,936 B2 | * | 6/2008 | Huhtasalo et al. | 29/846 |
| 2008/0314626 A1 | * | 12/2008 | Moore | 174/255 |
| 2011/0121058 A1 | | 5/2011 | Nishimoto | |

FOREIGN PATENT DOCUMENTS

| | | | |
|---|---|---|---|
| JP | 2000049447 A | * | 2/2000 |
| JP | 2006/060064 | | 3/2006 |
| JP | 2009-510747 | | 3/2009 |
| JP | 2010-006870 A | | 1/2010 |
| KR | 10-2009-0121222 A | | 11/2009 |
| WO | WO 2010/007863 | | 1/2010 |

OTHER PUBLICATIONS

Ishikawajima Harima Heavy Ind Co LTD, Method for Heating Thin Film With Microwave, Dec. 29, 2010, http://www.19.ipdl.inpit.go.jp/PAI/result/detail/main/wAAA9naivZDA418060064P1.*

* cited by examiner

*Primary Examiner* — Quang Van
(74) *Attorney, Agent, or Firm* — McKenna Long & Aldridge LLP

(57) ABSTRACT

In a method for forming conductive patterns, a substrate is provided, and a pattern is formed on the substrate using a conductive pattern-forming composition and a printing method. The substrate with the pattern formed is positioned between two microwave-permeable panels and the pattern is fired using microwave. In a method for forming conductive patterns, the substrate is fixed by the microwave-permeable material during the firing of conductive patterns, and accordingly the deformation of substrate can be prevented and the firing process can be facilitated.

5 Claims, 4 Drawing Sheets

METHOD FOR FORMING CONDUCTIVE PATTERNS USING MICROWAVE

CROSS-REFERENCE TO RELATED APPLICATIONS

This application claims the priority of Korean Patent Application No. 10-2010-0008660 filed on Jan. 29, 2010, in the Korean Intellectual Property Office, the disclosure of which is incorporated herein by reference.

BACKGROUND OF THE INVENTION

1. Field of the Invention

The present invention relates to a method for forming conductive patterns. More specifically, the present invention relates to a method for forming conductive patterns, which is capable of preventing a substrate from being deformed during firing of conductive patterns and enabling a firing process to be easily performed.

2. Description of the Related Art

Conductive patterns are necessarily formed in transparent substrates for displays or circuit boards for electronic parts which are recently used.

Such conductive patterns are often formed by a photosensitive paste method, or a photo-etching method. In the photosensitive paste method, a photosensitive electrode paste is applied on a substrate using a screen printer. Then, the substrate is exposed to UV using a photomask. A portion of the photosensitive electrode paste which is exposed to UV is photo-crosslinked and thus not etched by an aqueous alkaline solution. On the contrary, another portion of the photosensitive electrode paste which is not exposed to UV is not photo-crosslinked and thus etched by an aqueous alkaline solution. Consequently, an electrode pattern is formed on the substrate. However, such a method of forming an electrode using a photosensitive electrode paste has a disadvantage that it is difficult to control the pitch accuracy and the electrode width.

Meanwhile, in the photo etching method, an electrode is mainly formed by an entire-surface coating or a vapor deposition/etching process. However, such a method of forming an electrode by vapor deposition has problems of prolonged process time, high cost of a thin film-forming device and material, and environmental pollution due to etching. Therefore, an attempt to replace conventional processes by printing methods such as inkjet, offset and gravure printings has been recently proposed.

Using such printing methods, the unnecessary consumption of material may be reduced by printing only a required amount of material on necessary regions, and the process may be simplified as it is unnecessary to use a mask.

Forming of patterns by printing involves a firing process, and residual organic substances and solvents must be removed by the firing process to impart conductivity to a metal. As a firing process, various firing processes ranging from firing by a traditional electric furnace to firing by recent microwave or plasma firing are applied. Particularly, the microwave firing is remarkable in that it is able to fire selectively by increasing only the temperature of metal wiring absorbing microwave without thermal-impact on a substrate, thereby obtaining a product having the same quality as that obtained from a high-temperature firing in short time and also preventing the substrate from being damaged.

However, in case of the microwave firing, thermal energy is only concentrated on wiring, and therefore, a difference in shrinkage between the wiring and substrate may be greater than that in the case of other firing methods, thereby leading to the deformation of the substrate. Particularly, such deformation may occur more severely in a flexible substrate such as PET which is popularly used in recent years.

SUMMARY OF THE INVENTION

An aspect of the present invention provides a method for forming conductive patterns, which is capable of preventing the deformation of substrate and wiring which may occur during a firing process when forming conductive patterns.

According to an aspect of the present invention, there is provided a method for forming conductive patterns, including the steps of: 1) providing a substrate; 2) patterning on the substrate using a conductive pattern-forming composition and a printing method; and 3) positioning the patterned-substrate between two microwave-permeable panels and firing the pattern using microwave.

In the step 1), the substrate may be a glass or plastic substrate.

In the step 1), the substrate may include at least one selected from the group consisting of polyethylene terephthalate(PET), polysulfone(PSF), polyethersulfone(PES), polycarbonate(PC), polyimide(PI) and cycloolefin polymers (COP).

In the step 2), the conductive pattern-forming composition may include conductive particles and solvents.

In the step 2), the printing method may be selected from a screen, gravure, offset, flexo or inkjet printing method.

In the step 3), the panels may be ceramic panels.

In the step 3), the panels may be alumina panels.

In the step 3), the panels may include at least one selected from the group consisting of zirconia, titania and SiC composite.

In the step 3), the two panels may be formed of the same material.

In addition, the present invention provides conductive patterns formed according to the method for forming conductive pattern of the present invention.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
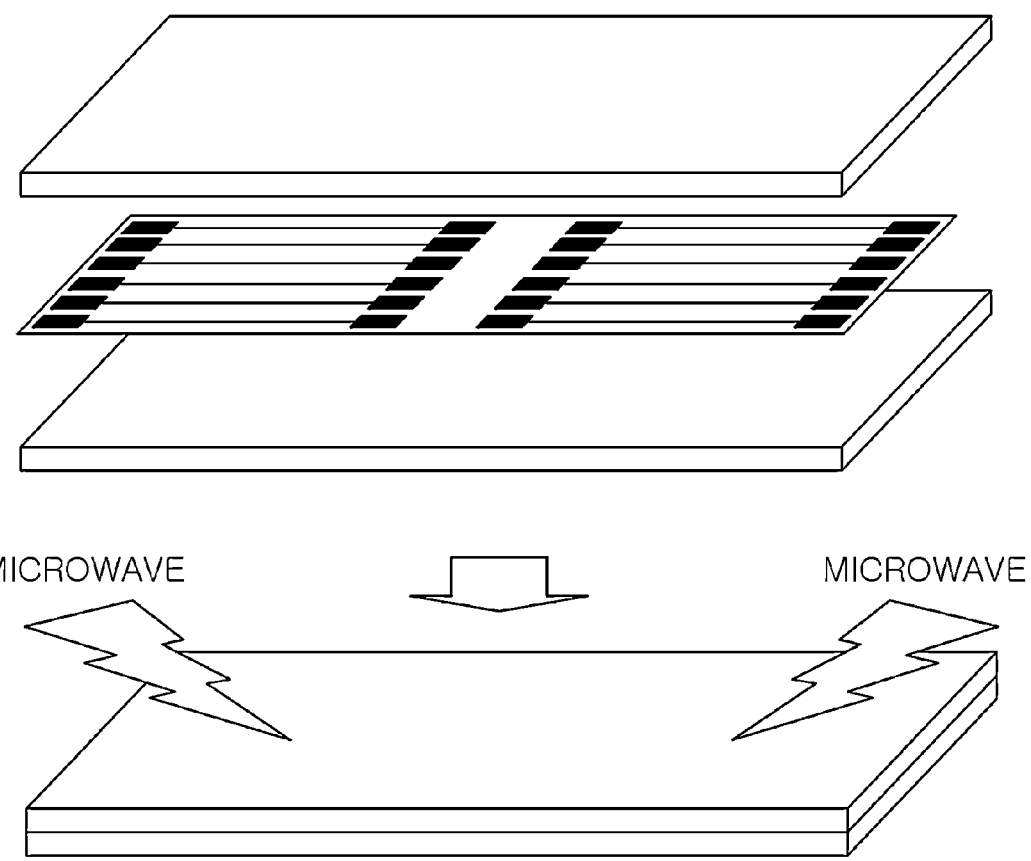
FIG. 1 schematically illustrates a method for forming conductive patterns according to an embodiment of the present invention.

Exemplary embodiments of the present invention will now be described in detail with reference to the accompanying drawings.

A method for forming conductive patterns according to the present invention includes the steps of: 1) providing a substrate, 2) forming patterns on the substrate using a conductive pattern-forming composition and a printing method, and 3)

positioning the patterned substrate between two microwave-permeable panels and firing the patterns using microwave.

The present invention is directed to minimizing deformation of a substrate during microwave firing when forming conductive patterns on transparent substrates for displays or circuit boards for electronic parts.

In related art methods for forming conductive patterns by printing using conductive particles, thermal energy is concentrated on wirings during microwave firing that is generally used for rapid firing, and therefore a difference in shrinkage between the wiring and substrate is increased. This difference in shrinkage results in the deformation of substrate, and particularly such deformation may occur more severely in a film-like polymer substrate such as PET. Further, such deformation makes it difficult to apply post-processes, produces disconnection, and raises the percentage of defective substrates.

Therefore, in order to prevent such deformation of substrate, the method of the present invention employs inserting a substrate between microwave-permeable panels which are not deformed at high temperature and firing the substrate, thereby preventing the deformation of the substrate while ensuring the advantage of the selective firing which is obtainable by microwave firing.

In related art printing methods including microwave firing, conductivity is imparted to a substrate by simply heating the substrate to remove solvents and organic substances in a wiring. However, in the present invention, since the substrate is fixed in such a way that it is inserted between two microwave-permeable panels, the deformation of the substrate can be prevented while ensuring rapid and selective firing which is the advantage of microwave firing.

In the method for forming conductive patterns according to the present invention, the substrate of the step 1) is not particularly limited, but substrates such as glass and plastic substrates suitable for use as substrates for displays or electronic parts may be used. Exemplary examples of the plastic substrates include polyethylene terephthalate (PET), polysulfone (PSF) polyethersulfone (PES) polycarbonate (PC), polyimide (PI), and cycloolefin polymers (COP), but the present invention is not limited thereto.

The step 1) may include additional steps such as washing and/or pre-treating the substrate. The washing and/or pre-treating of the substrate may be properly selected depending on the type of substrate or printing composition. More specifically, the substrate may be washed by plasma cleaning, and/or subjected to hydrophobic treatment as pretreatment, but the present invention is not limited thereto.

Furthermore, in order to forming conductive patterns having fine line width, the substrate of the step 1) may be subjected to hydrophobic treatment. The hydrophobic treatment may be performed using any method known in the art, and more specifically, methods such as plasma treatment, SAM coating and surfactant coating may be used.

In the method for forming conductive pattern according to the present invention, the conductive pattern-forming composition of the step 2) may use any composition known in the art. More specifically, the conductive pattern-forming composition may include conductive particles, solvents, and other additives. Exemplary examples of the conductive particles include Ag, Cu, Au, Cr, Al, W, Zn, Ni, Fe, Pt, Pb, alloys thereof, and mixtures thereof, but the present invention not limited thereto.

The diameter of the conductive particles is 500 nm or less, preferably 200 nm or less, and more preferably 100 nm or less. The diameter of the conductive particles is preferably 0.1 nm or more, and more preferably 5 nm or more.

Exemplary examples of the solvents include water, acetone, methylethyl ketone, methylisobutyl ketone, methyl cellosolve, ethyl cellosolve, tetrahydrofuran, 1,4-dioxane, ethylene glycol dimethylether, ethylene glycol diethylether, propylene glycol methylether, propylene glycol dimethylether, propylene glycol diethylether, chloroform, methylene chloride, 1,2-dichloroethane, 1,1,1-trichloroethane, 1,1,2-trichloroethane, 1,1,2-trichloroethene, hexane, heptane, octane, cyclohexane, benzene, toluene, xylene, methanol, ethanol, isopropanol, propanol, butanol, t-butanol, cyclohexanon, propylene glycol methylether acetate, propylene glycol ethylether acetate, 2-methoxybutyl acetate, ethyl 3-ethoxypropionate, ethyl cellosolve acetate, methyl cellosolve acetate, butyl acetate, methylethyl ketone, methylisobutyl ketone, ethylene glycol monomethylether, γ-butyllactone, N-methylpyrrolidone, dimethylformamide, tetramethylsulfone, ethylene glycol acetate, ethylether acetate, ethyl lactate, polyethylene glycol, cyclohexanon, and mixtures thereof, but the present invention is not limited thereto.

The additives include dispersions and surfactants, but the present invention is not limited thereto.

In the method for forming conductive patterns according to the present invention, the printing method of the step 2) may include all printing methods known in the art. More specifically, such printing methods include a screen, gravure, offset, flexo, and inkjet printing method, as well as modified printing methods based on the methods.

The pattern formed in the step 2) is positioned between two microwave-permeable panels, and is fixed through the panels. In this case, any panel which is not deformed at high temperature and allows microwave to be penetrated may be available, and particularly ceramic panels are preferably used.

Exemplary examples of the ceramic panels include alumina panels, but the present invention is not limited thereto. In addition, the panels may include at least one selected from the group consisting of zirconia, titania and SiC composite. The two panels are preferably formed of the same material.

The pattern formed in the step 2) is fixed by being positioned between two microwave-permeable panels, and subsequently the pattern is fired using microwave to form a conductive pattern. For the fixation by panels, any fixation mechanism may be used as long as the mechanism may be easily released after firing, the deformation of substrate may be prevented, and the patterned-substrate may be pressed via the panels. More specifically, the substrate may be fixed using the normal load of panels or may be fixed using separate physical devices, but the present invention is not limited thereto.

In the microwave firing, high power microwave is irradiated on the substrate, molecules in the pattern formed on the substrate are vibrated to generate heat, and the pattern is fired by the generated heat. The temperature and duration of microwave firing may be properly selected depending on the type of substrate used.

Particularly, in the present invention, since the patterned substrate is fixed by microwave-permeable panels, the panels may absorb heat during microwave firing. Accordingly, a high temperature condition or prolonged firing time than typical firing conditions is preferably used. For microwave firing, an apparatus such as a low temperature microwave firing furnace made by UNICERA may be used, but the present invention is not limited thereto.

In the method for forming conductive patterns according to the present invention, the panels may be easily removed after the completion of the step 3).

An embodiment of the method for forming conductive patterns according to the present invention is schematically shown in FIG. 1.

In the method for forming conductive patterns by printing using conductive particles according to the present invention, since the substrate is positioned between 2-layered panels, the deformation of substrate can be prevented during microwave firing while ensuring rapid and selective firing which is an advantage of microwave firing. Accordingly, high quality conductive patterns can be obtained without the deformation of substrate. In addition, the present invention provides conductive patterns formed according to the above-described method for forming conductive patterns.

According to the present invention, conductive patterns can be rapidly fired by using microwave firing as compared to firing process by using a conventional box furnace or oven. Furthermore, since energy can be selectively irradiated on conductive patterns using the method of the present invention, more dense structure can be formed at the same temperature and time as compared to other firing methods, and consequently conductivity is increased.

Hereinafter, the present invention will be more specifically described with reference to the following Examples.

These Examples is intended to illustrate the present invention, but the present invention is not limited thereto.

EXAMPLES

Example 1

Figure 2:
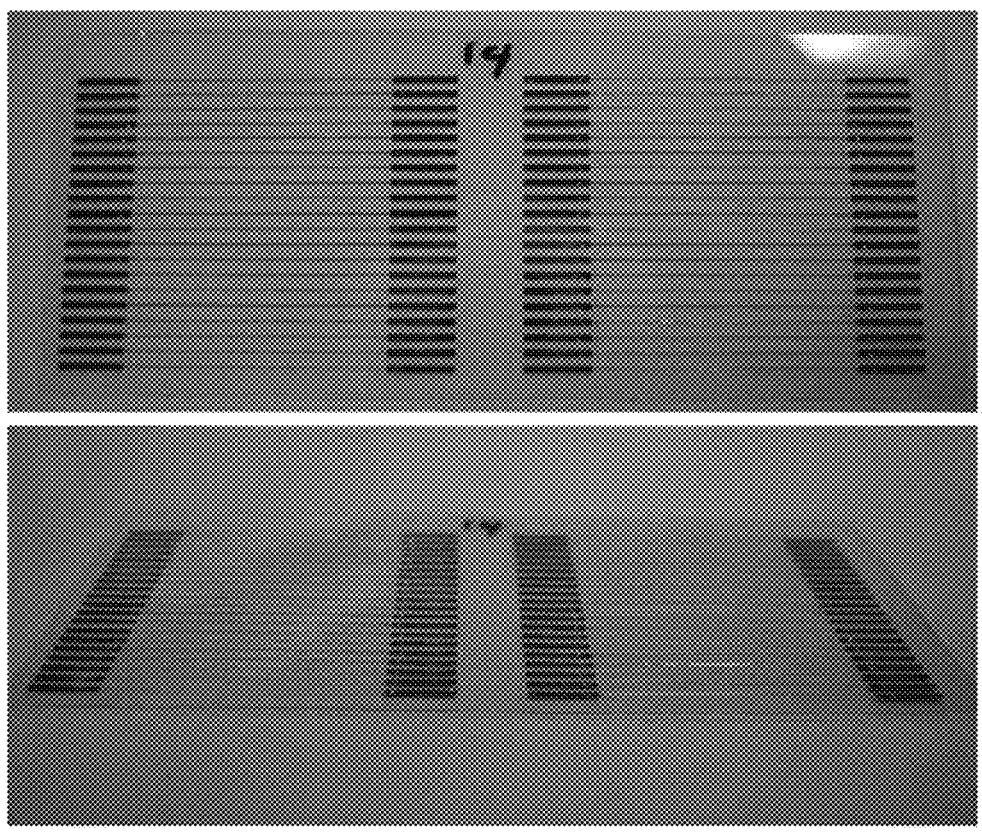
FIG. 2 is an image showing a conductive pattern formed according to Example 1 of the present invention.
Figure 3:
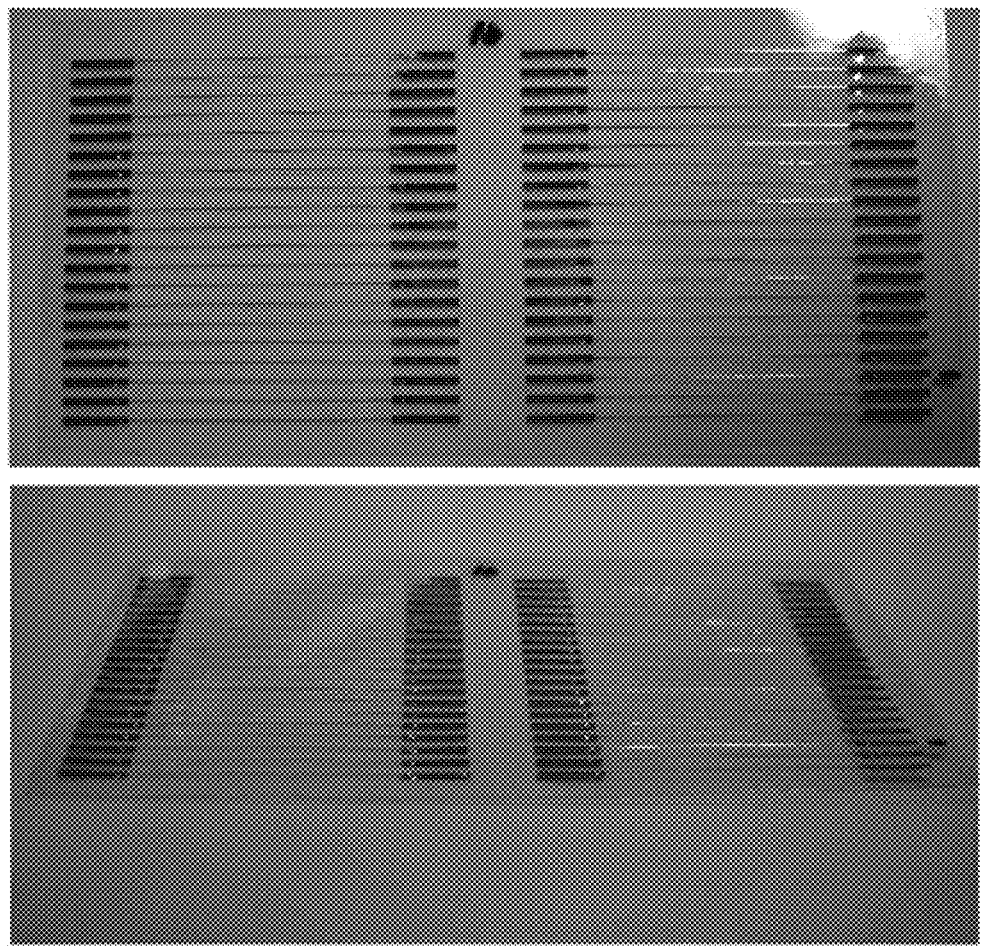
FIG. 3 is an image showing a conductive pattern formed according to Example 2 of the present invention.

A silver (Ag) pattern was printed on a COP (CycloOlefin Polymer) substrate by a inkjet printing method, and the pattern was sandwiched between two alumina panels and then fired in a microwave firing furnace at 30% power for 12 minutes. The substrate was not deformed, and about 50 Ω/cm of line resistance was measured. The result of Example 1 was shown in FIG. 2.

Example 2

An Ag pattern was printed on a COP substrate by an inkjet printing method, and the pattern was sandwiched between two alumina panels and then fired in a microwave firing furnace at 50% power for 6 minutes. The substrate was not deformed, and about 37 Ω/cm of line resistance was measured.

Comparative Example 1

Figure 4:
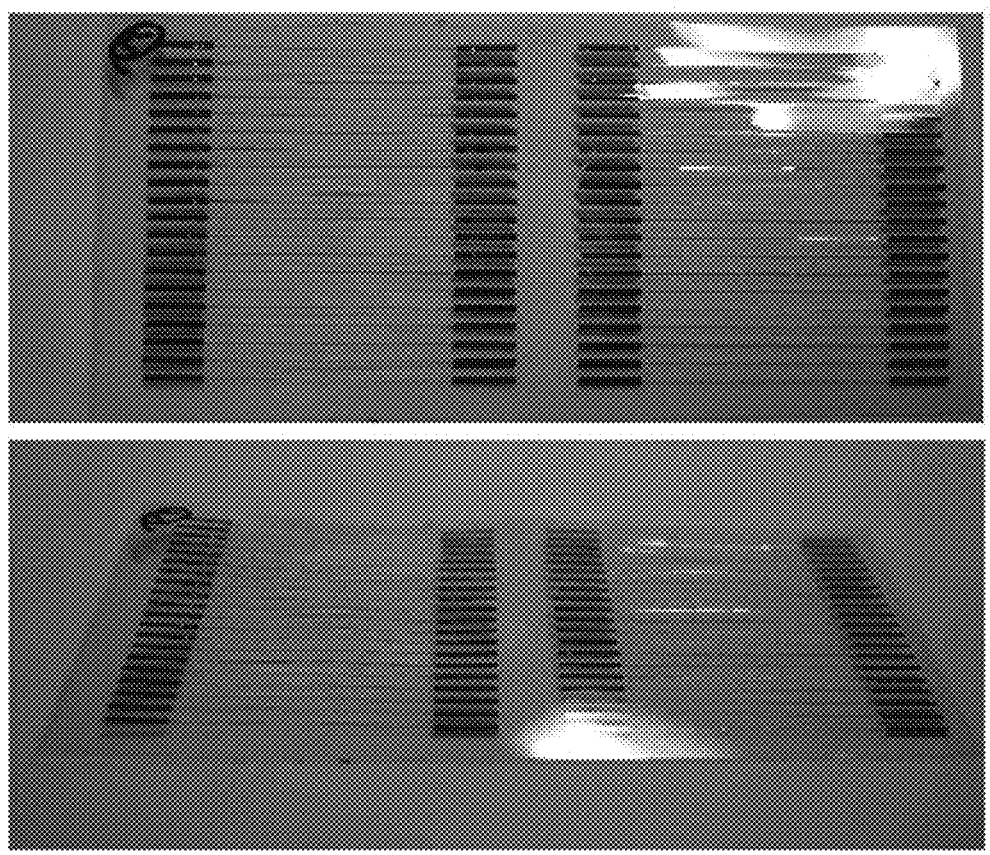
FIG. 4 is an image showing a conductive pattern formed according to Comparative Example 1 of the present invention.

An Ag pattern formed as in Examples above was fired in a microwave firing furnace for 8 minutes without using alumina panels. The flexural deformation of substrate was generated due to a difference in shrinkage between substrate and wiring, and line resistance was equally measured as 50 Ω/cm. The result of Comparative Example 1 was shown in FIG. 4.

As aforementioned, in the method for forming patterns by printing using conductive particles according to the present invention wherein the substrate was positioned between 2-layered panels, it was demonstrated that rapid and selective firing which is the advantage of microwave firing was obtained, and also the deformation of substrate was prevented during microwave firing, thus enabling to obtain high quality conductive patterns without the deformation of the substrate.

According to the method for forming conductive patterns of the present invention by printing using conductive particles, since a substrate is positioned between 2-layered panels, the deformation of substrate can be prevented during microwave firing while ensuring rapid and selective firing which is an advantage of microwave firing. Accordingly, high quality conductive patterns without the deformation of substrate can be obtained.

While the present invention has been shown and described in connection with the exemplary embodiments, it will be apparent to those skilled in the art that modifications and variations can be made without departing from the spirit and scope of the invention as defined by the appended claims.

What is claimed is:

1. A method for forming conductive patterns, the method comprising:
   providing a substrate;
   forming a pattern on the substrate using a conductive pattern-forming composition and a printing method;
   positioning the substrate with the pattern formed between two microwave-permeable panels and firing the pattern using microwave; and
   removing the two panels,
   wherein the two panels are formed of a same material, and
   wherein the panels comprise at least one selected from the group consisting of zirconia, titania, and an SiC composite.

2. The method according to claim 1, wherein the substrate comprises a glass or plastic substrate.

3. The method according to claim 1, wherein the substrate comprises at least one selected from the group consisting of polyethylene terephthalate(PET), polysulfone(PSF), polyethersulfone(PES), polycarbonate(PC), polyimide(PI) and cycloolefin polymers(COP).

4. The method according to claim 1, wherein the conductive pattern-forming composition comprises conductive particles and solvents.

5. The method according to claim 1, wherein the printing method is selected from a screen, gravure, offset, flexo and inkjet printing method.

* * * * *